United States Patent [19]

Ryczek et al.

[11] 4,329,730
[45] May 11, 1982

[54] D.C. SWITCH CIRCUIT

[75] Inventors: Lawrence J. Ryczek, Greendale; Donald L. Van Zeeland, Greenfield, both of Wis.

[73] Assignee: Eaton Corporation, Cleveland, Ohio

[21] Appl. No.: 158,760

[22] Filed: Jun. 12, 1980

[51] Int. Cl.³ .............................................. H02H 3/00
[52] U.S. Cl. .................................. 361/100; 330/207 P
[58] Field of Search ............... 361/100, 101, 98, 29, 361/94; 340/650; 307/247 R, 252 F, 252 J, 254, 262, 592; 330/207 P, 298

[56] References Cited

U.S. PATENT DOCUMENTS

3,295,020 12/1966 Borkovitz ..................... 361/100 X
3,987,316 10/1976 Bogel et al. ..................... 307/293
4,057,299 11/1977 Jones ..................... 303/92
4,268,884 5/1981 Ford, Jr. et al. ..................... 361/94 X Primary Examiner—Reinhard J. Eisenzopf
Attorney, Agent, or Firm—C. H. Grace; M. L. Union

[57] ABSTRACT

A circuit for a switch which receives an input from a sensor head (18) such as a proximity sensor, limit switch, or other type of condition-responsive sensor. In its most complex form the circuit includes a power supply/regulator (24), an output load current source (12), an output load current sink (14), input logic (16) to receive the signal from the sensing head, a selector (10) to determine whether the source and sink will be normally open or normally closed, and a device (26) for checking the outputs for faults and indicating the presence of such. Other circuits include certain combinations of these parts or variations of these parts.

16 Claims, 6 Drawing Figures

D.C. SWITCH CIRCUIT

BACKGROUND OF THE INVENTION

This invention relates to logic circuits for D.C. proximity or limit switches and in particular to circuits which are protected from and indicate shorted or open load conditions and which can be switched from normally open (N.O.) to normally closed (N.C.) and vice versa.

It is known in the prior art to provide flashing indicators by means of an oscillator powering a light-emitting diode (LED). It is also known generally that a silicon-controlled rectifier (SCR) or programmable unijunction transistor (PUT) can be used to protect a power switching element, such as a transistor, from overcurrent. It would be desirable and advantageous, however, to provide a proximity or limit switch which indicates a shorted or open load via a flashing indicator, protects its power switching elements from such shorted or open loads, and which can be readily changed from a normally open switch to a normally closed one and back.

SUMMARY OF THE INVENTION

This invention involves the switch circuitry of a D.C. proximity, limit, or other type of sensor switch. Included in this circuit are means for switching the polarity of the outputs from normally open to normally closed or vice versa, a power supply and regulator, input logic to receive and interpret the input signal from the sensing means, current source and/or current drain drivers, and fault checking and indication means, to indicate whether and when the load connected to one of the drivers is open or shorted.

One object of the invention is to provide a D.C. switch circuit having source and sink current outputs.

Another object of the invention is to provide a D.C. switch as described above which has a circuit for checking for and indicating faults such as an open or shorted load.

A further object of the invention is to provide a D.C. switch circuit as described above which can be changed from a normally open switch to a normally closed one, or from normally closed to normally open, without the use of mechanical switches or jumper wires.

Other objects and advantages of the invention will appear hereinafter.

DESCRIPTION OF THE PREFERRED EMBODIMENT

Figure 1:
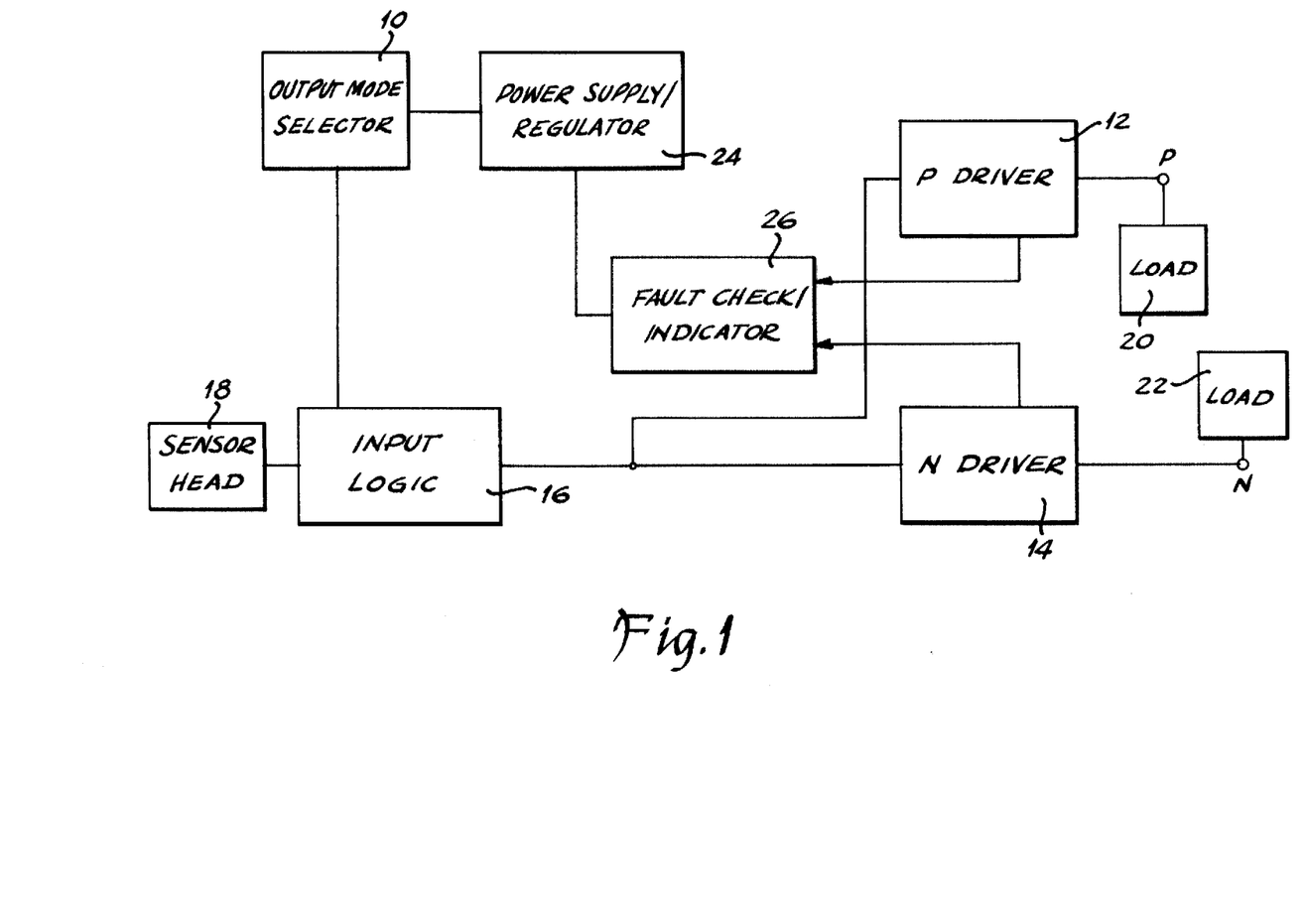
FIG. 1 is a block diagram of a circuit embodying the invention.

Referring to FIG. 1, the output mode selector 10 determines the output polarity of the circuit, that is, whether the source or P driver 12 and sink or N driver 14 are normally open (N.O.) or normally closed (N.C.). Selector 10 then sends this information to the input logic circuit 16. The input logic takes the information received from the sensor head 18, whether it be a proximity sensor, limit switch, or other sensor, and relays it to drivers 12 and 14. These drivers drive output loads 20 and 22 which may be connected thereto, using power supplied by the power supply/regulator 24. A fault check/indicator 26 determines whether the output loads are open or shorted.

Figure 2:
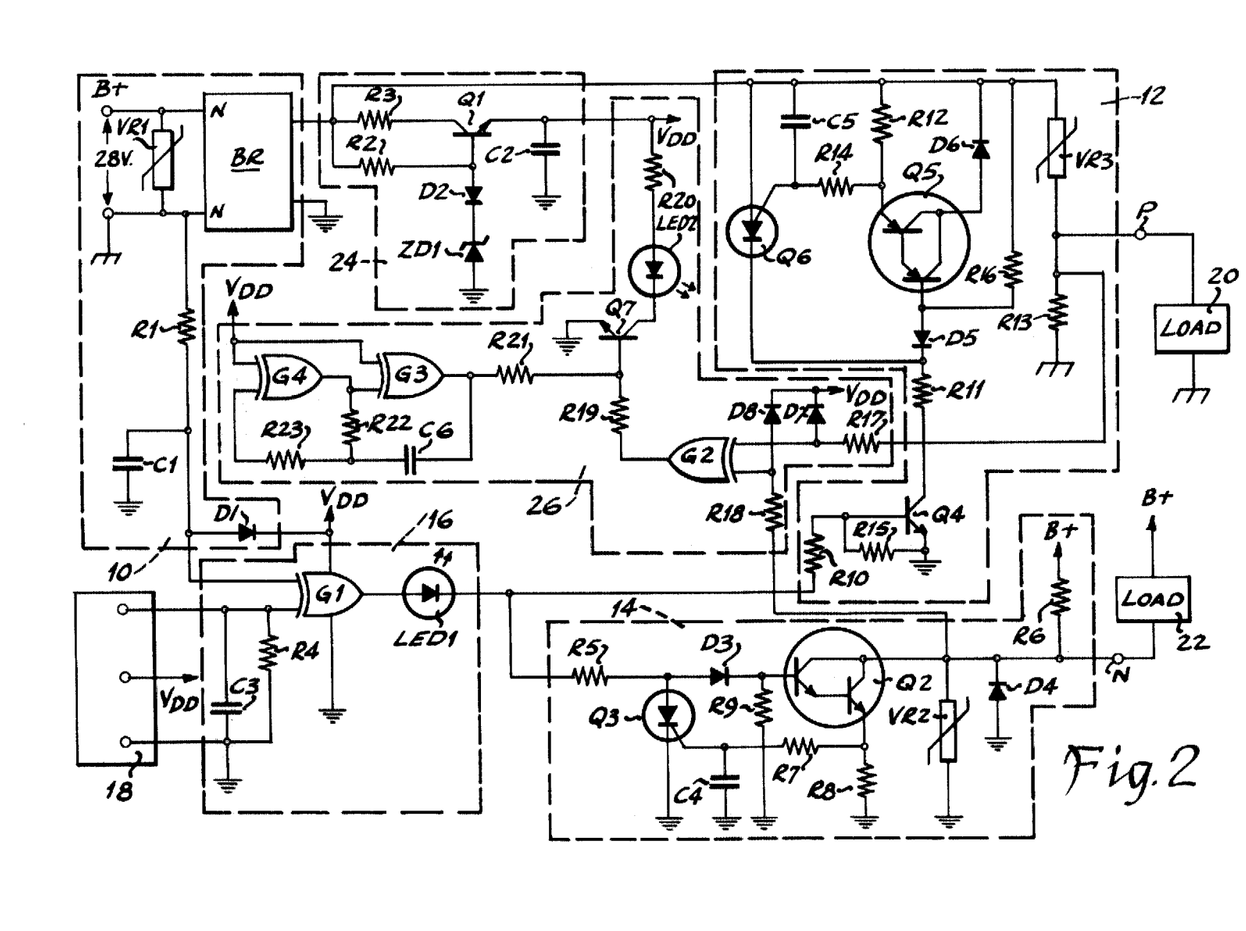
FIG. 2 is a diagrammatic view of the circuit shown in block diagram form in FIG. 1.

FIG. 2 shows in detail the circuit shown in the block diagram of FIG. 1. The output mode selector 10 includes a full-wave rectifying bridge BR, a resistor R1, a filter capacitor C1, and a diode D1. Bridge BR serves to provide the power supply/regulator 24 with the same polarity voltage regardless of whether D.C. source 28 has its positive terminal connected to the B+ terminal or the GND terminal. Varistor VR1 serves to clip transients, while diode D1 limits the voltage from output mode selector 10 to input logic 16 to no more than $V_{DD}$.

Power supply/regulator 24 includes transistor Q1 which is biased by current from resistor R2. Resistor R2 also biases zener diodes ZD1 to give a regulated voltage $V_{DD}$. The rest of the circuit includes resistor R3, temperature compensation diode D2 and filter capacitor C2. Resistor R3 is a positive temperature coefficient thermistor, which protects the voltage supply/regulator from overcurrent from bridge BR if $V_{DD}$ is inadvertently shorted.

Input logic circuit 16 includes exclusive-OR gate G1, resistor R4, capacitor C3 and light emitting diode LED1. Resistor R4 and capacitor C3 form a high impedance control input from sensor head 18. Thus gate G1 compares the signal it receives from output mode selector 10 to that received from head 18, and its output reacts accordingly. Diode LED1 indicates when the output of gate G1 is high.

The output of circuit 16 is then fed into P and N drivers 12 and 14. Referring first to N driver 14, current from circuit 16 is directed through current-limiting resistor R5 and diode D3 into the base of Darlington pair Q2. This switches Q2 to its conductive state, allowing current to flow through load 22. Resistor R6 is a pull-up resistor, which ensures that the N terminal is at B+ voltage when Q2 is off. Varistor VR2 protects Q2 from positive voltage transients, while diode D4 protects Q2 from negative voltage transients. In addition, Q2 is protected from overcurrents by SCR Q3, resistors R7 and R8, and capacitor C4 in the following manner. The current passing through resistor R8 is approximately load current. As that current becomes excessive for Q2 to carry, a sufficient voltage appears across resistor R8 to cause a voltage across resistor R7, resulting in current through R7 into the gate of SCR Q3. When SCR Q3 becomes conductive, it drains the current from R5 before the current reaches the base of Q2. Robbed of its base current, Q2 turns off, preventing any damage. Capacitor C4 and resistor R7 provide for a time delay before SCR Q3 turns on, so that a short surge of overcurrent does not turn Q2 off. Diode D3 provides the necessary junction drop to prevent any current from flowing through the base junctions of Q2. Resistor R9 prevents leakage current turn-on of Q2.

Other than a reversal of polarity, that is, acting as a current source rather than a current sink, P driver 12 functions similarly to N driver 14 in driving load 20. Current from circuit 16 passes through resistor R10 and into the base of transistor Q4. Thus Q4 is turned on, allowing current to leave the base of Darlington pair Q5 through diode D5 and resistor R11. Load current passes through resistor R12 and Q5 to load 20. Resistor R13 is a pull-down resistor, and varistor VR3 protects Q5 from negative voltage transients. Resistors R12 and R14, capacitor C5 and PUT Q6 protect Q5 from over currents while not tripping for short surges. Diode D6 protects Q5 from positive voltage transients, while resistors R15 and R16 prevent leakage current turn-on of Q4 and Q5 respectively.

Thus, if D.C. source 28 is connected as shown with its positive terminal to B+ and its negative terminal to ground (GND), the circuit is in its N.O. mode, since both inputs to gate G1 are low, resulting in a low output from gate G1, which in turn means that both Q2 and Q5 will be off. The circuit is changed to its N.C. mode by reversing the connections of D.C. source 28. Gate G1 then has one high input and one low input, resulting in a high output, which in turn means that Q2 and Q5 will be on. In either case, an input from the sensing head, whether it be a proximity sensor, limit switch, or other condition-responsive sensor, will, through gate G1, switch the N.O. circuit on or switch the N.C. circuit off as long as the sensed condition exists.

As stated earlier, an additional feature of this circuit is the fault check/indicator 26. The fault check/indicator includes fault sensor 26a, fault indicator 26b, and an astable oscillator 26c. Fault sensor 26a includes an exclusive-OR gate G2, which receives inputs from the outputs of P and N drivers 12 and 14, through resistors R17 and R18. The purpose of diodes D7 and D8 is to limit the voltages of those inputs to no more than the value of $V_{DD}$. Since under normal conditions (that is, assuming no load faults) only one of the driver outputs, and hence only one of the inputs to G2, will be high, while the other is low, the output of G2 will normally be high. Thus current will flow from G2 through current limiting resistor R19 into the base of transistor Q7 of fault indicator 26b, turning it on. This in turn allows current to flow out of power supply/regulator 24 through resistor R20 and energize light-emitting diode LED2, causing it to emit a steady light. Thus LED2 normally functions as a "Power-On" indicator. In the event of a load fault, however, both inputs to gate G2 become the same, that is, high or low depending upon the particular fault. This makes the output of gate G2 low, such that it no longer supplies base drive to Q7. Base drive for Q7 is now supplied by oscillator 26c formed by exclusive-OR gates G3 and G4, resistors R21, R22 and R23, and capacitor C6. Since the base drive of Q7 is oscillating, collector current also oscillates, causing LED2 to flash on and off. Thus a human operator can tell immediately that a fault exists due to the flashing indicator LED2.

Figure 3:
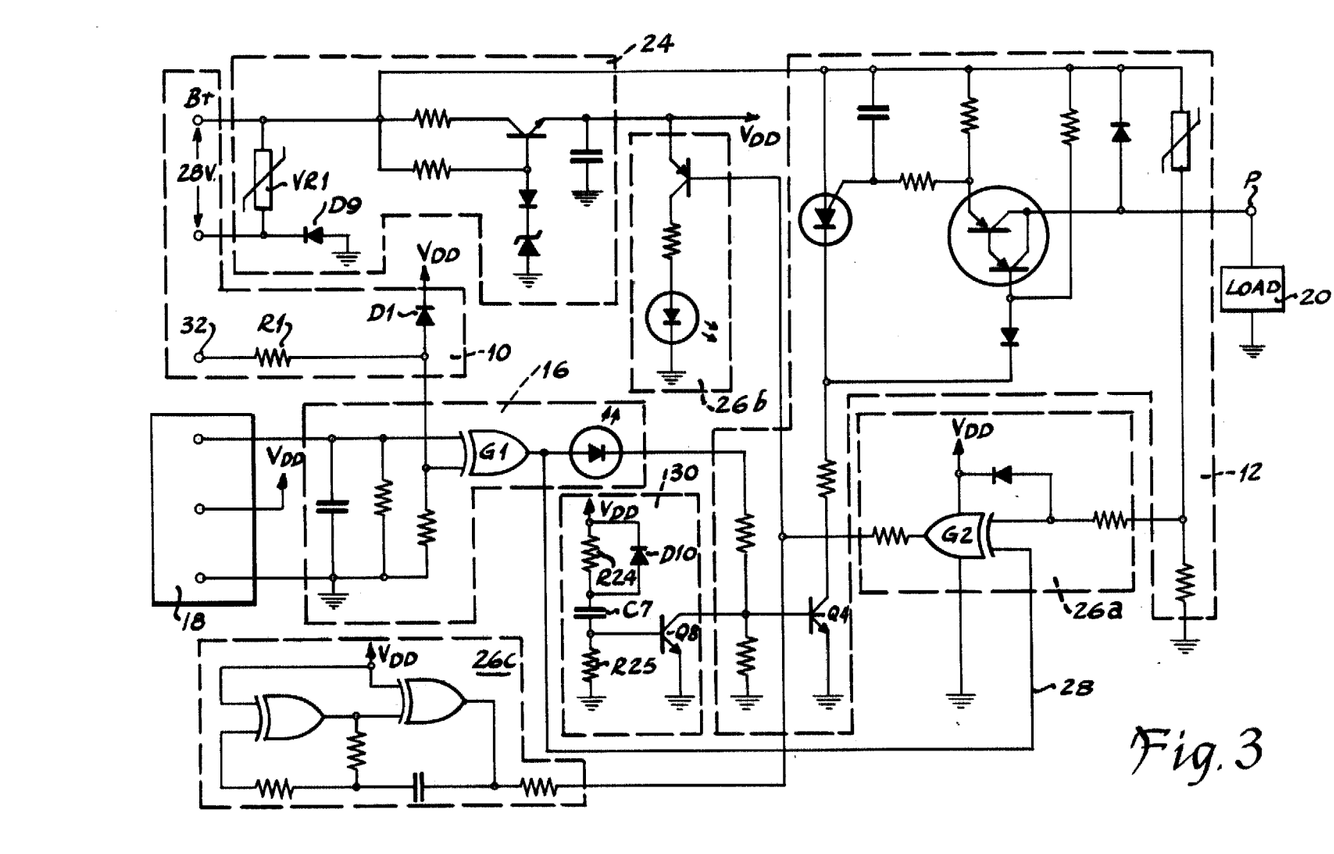
FIG. 3 is an alternative embodiment having only a source output which can be made either normally open or normally closed.
Figure 4:
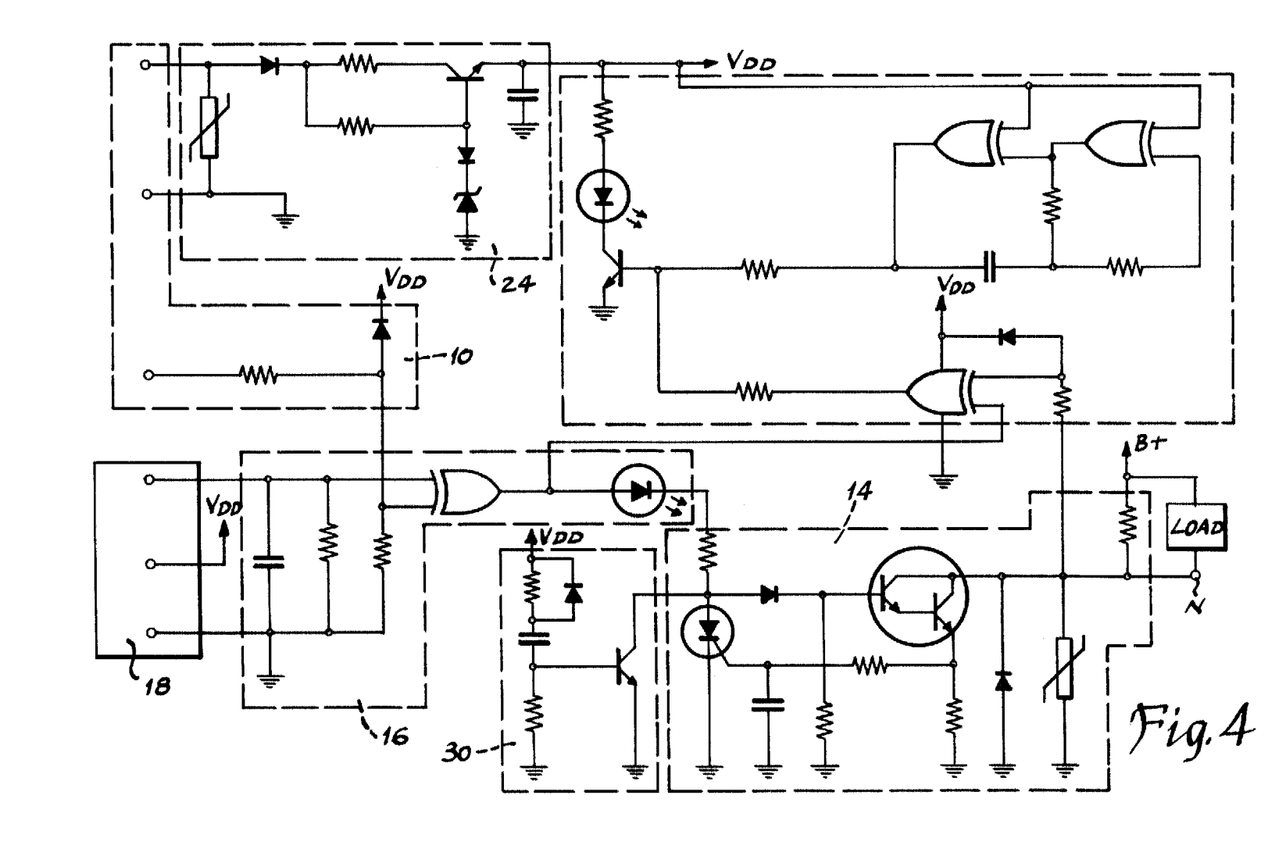
FIG. 4 is another alternative having only a sink output which can be made either normally open or normally closed.

Illustrated in FIGS. 3 and 4 are simpler versions of the circuit described above, each having only one output driver. The circuit shown in FIG. 3 has only a P driver 12, which is identical to P driver 12 shown in FIG. 2. Power supply/regulator 24 is also identical to the one shown in FIG. 2 except for the addition of varistor VR1 and diode D9 for input protection. Further, fault sensor 26a is the same except that, since there is no N driver the output of which is to be checked, the second input to gate G2 is obtained from the output of gate G1 via conductor 28, such that trouble is indicated when the output and control do not agree. Since these parts of the circuit, including indicator circuit 26b and oscillator 26c, are identical to those shown in FIG. 2, the reference characters for the components are the same, and reference characters will be shown only for those components specifically mentioned in connection with the description of the other parts of the circuit.

An added feature provided in this circuit is a power-up clamp 30, the purpose of which is to ensure that the output is off when power is applied to the circuit, regardless of any transients encountered during the turn-on process. The clamp 30 includes resistors R24 and R25, a capacitor C7, a diode D10 and a transistor Q8. When power is applied, capacitor C7 passes current to the base of Q8 and begins to charge. Transistor Q8 thus drains base current away from Q4 so that P driver 12 remains off unitl capacitor C7 reaches full charge.

The output mode selector 10 and input logic 16 are also altered in the circuit shown in FIG. 3. Since bridge BR is eliminated, output polarity can no longer be reversed by reversing the connections of D.C. source 28. Output polarity can be changed, however, by use of a third terminal 32. Leaving this terminal unconnected, as shown, will make the output N.O., since resistor R26 pulls that input to gate G1 low. On the other hand, connecting terminal 32 to the B+ terminal, and thus to the higher voltage terminal of source 28, results in a high input to gate G1, and thus a N.C. output.

The circuit shown in FIG. 4 is identical to that shown in FIG. 3, except that N driver 14 is substituted for P driver 12.

Figure 5:
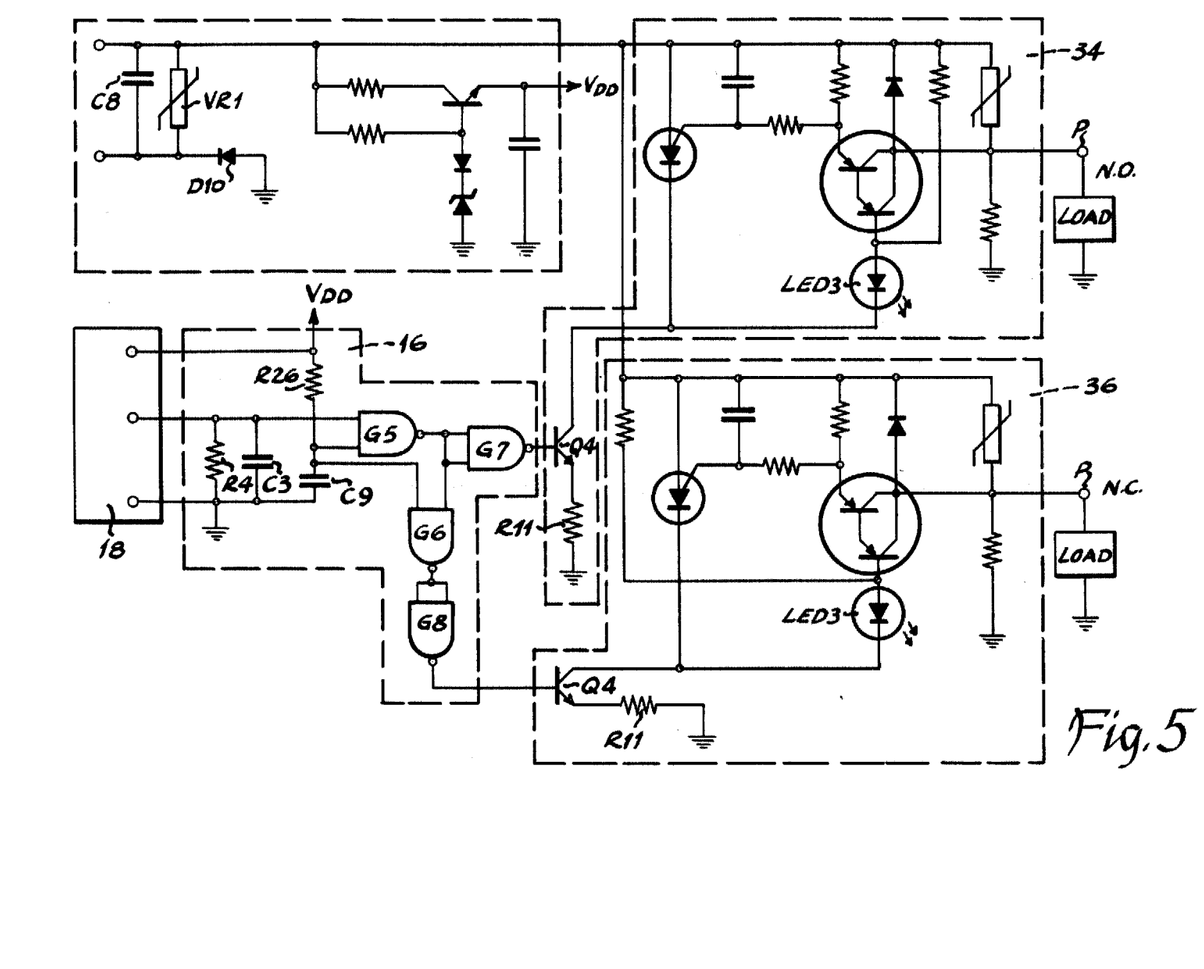
FIG. 5 is a further alternative having two source outputs, one of which is normally open while the other is normally closed.
Figure 6:
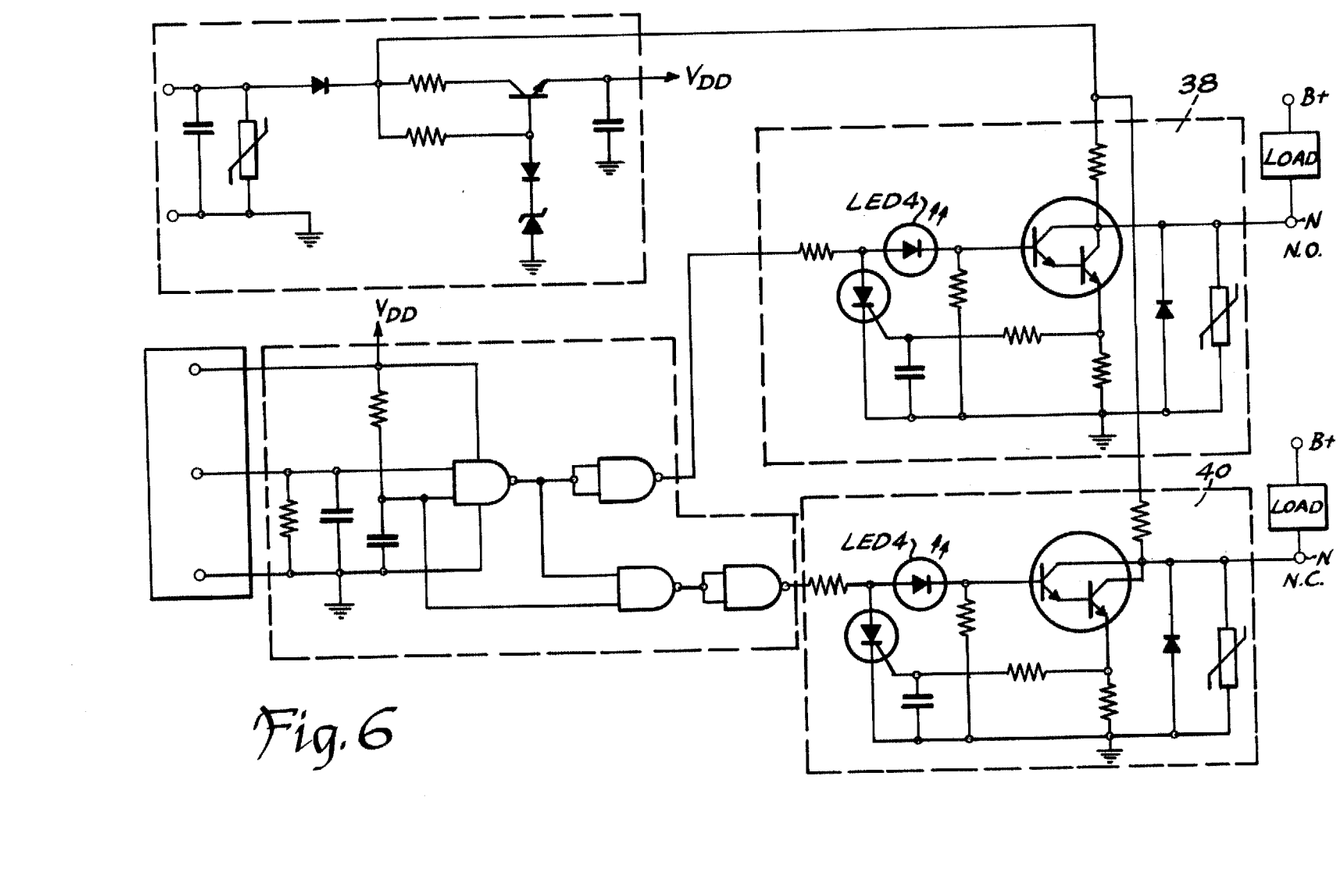
FIG. 6 is another alternative having two sink outputs, one of which is normally open while the other is normally closed.

FIGS. 5 and 6 illustrate circuits which have both N.O. and N.C. output driver circuits. In addition, in both circuits, the fault indication means has been incorporated into the output drivers.

Beginning with the circuit shown in FIG. 5, two P drivers 34 and 36 are used. The only differences between these P drivers and P driver 12 shown in FIG. 2 is that a light-emitting diode LED3 is sustituted for diode D5, and resistor R11 is put in the emitter circuit of Q4 rather than the collector circuit. This provides a constant current drive to insure that LED3 is at the same brightness level regardless of the value of the D.C. source voltage as B+. These LEDs serve as fault indicators, since each emits light only when the driver of which it is a part is on. Thus, since under normal conditions only one of the drivers and hence LEDs will be on while the other is off, a fault is indicated whenever both LEDs are the same, either on or off.

In both FIGS. 5 and 6, power supply/regulator 24 includes a capacitor C8 for circuit protection purposes. Input logic circuit 16 is different in that all four gates used in this circuit are NAND gates. Resistor R4 and capacitor C3 still provide a known input impedance. Resistor R26 and capacitor C9 provide a power-up clamp which functions as follows: one input to each of gates G5 and G6 is low until capacitor C9 reaches a predetermined proportion of $V_{DD}$. Thus the outputs of both gates are high. Gates G7 and G8 act as inverting buffers, and hence the outputs of both gates are low, resulting in both drivers being off. When the voltage across capacitor C9 reaches that proportion of $V_{DD}$, the input to gates G5 and G6 is high, resulting in a normally high output for gate G5 and a normally low output for gate G6. Hence in FIG. 5 P driver 34 will be N.O., while P driver 36 will be N.C.

The circuit shown in FIG. 6 is similar to that of FIG. 5 except that N drivers 38 and 40 are substituted for the P drivers of the prior figure. These N drivers are the same as those shown in FIG. 2 except that light-emitting diodes LED4 are substituted for diode D3 of FIG. 2, for simplification of the fault indicator as described above for FIG. 5.

While the circuits hereinbefore described are effectively adapted to fulfill the aforesaid objects, it is to be understood that the invention is not to be confined to the particular preferred embodiments herein set forth, inasmuch as they are susceptible of various modifications without departing from the scope of the appended claims.

What is claimed is:

1. A switching circuit, for receiving a signal from a sensing means and for driving a load in response to said signal, comprising in combination:
   means for regulating and supplying power to said circuit;
   at least one means for driving said load using power supplied by said power regulation and supply means;
   input logic means for receiving said signal from said sensing means and controlling said driving means in response thereto;
   means for indicating faults in said load being driven by and being responsive to the output of said driving means and being operable to indicate a power-on condition and both short-circuit and open-circuit faults; and
   means for selecting, as the output mode of said driving means, between a normally open mode and a normally closed mode.

2. A switching circuit as recited in claim 1 wherein said driving means includes at least one driver which acts as a current source with respect to a load connected to it.

3. A switching circuit as recited in claim 2 further comprising means for clamping said driving means off on application of power to said circuit until a predetermined time after said application of power.

4. A switching circuit, for receiving a signal from a sensing means and for driving a load in response to said signal, comprising in combination:
   means for regulating and supplying power to said circuit;
   at least one means for driving said load using power supplied by said power regulation and supply means;
   input logic means for receiving said signal from said sensing means and controlling said driving means in response thereto;
   means for selecting, as the output mode of said driving means, between a normally open mode and a normally closed mode; and
   means for indicating faults in said load being driven by said driving means, including both short-circuit and open-circuit faults; and
   wherein said driving means includes at least one driver which acts as a current sink with respect to a load connected to it.

5. A switching circuit as recited in claim 4 further comprising means for clamping said driving means off on application of power to said circuit until a predetermined time after said application of power.

6. A switching circuit as recited in claims 3 or 5 wherein said input logic means includes an exclusive-OR gate, wherein a D.C. source is connected to said circuit to provide power thereto, and wherein said mode selection is accomplished by connecting one input of said gate to one terminal of said D.C. source for said normally open mode and to the opposite terminal for said normally closed mode.

7. A switching circuit as recited in claim 6 wherein said fault indicating means comprises visual indicating means, which flashes alternately on and off when a fault is determined to exist.

8. A switching circuit as recited in claim 7 wherein said visual indicating means is caused to flash, when a fault is determined to exist, by oscillator means in circuit with said indicating means, and
   wherein said oscillator means is overridden by overriding means, and said indicating means thus prevented from flashing, when no fault is determined to exist.

9. A switching circuit, for receiving a signal from a sensing means and for driving load in response to said signal, comprising in combination:
   means for regulating and applying power to said circuit;
   at least one means for driving said load using power supplied by said power regulation and supply means;
   input logic means for receiving said signal from said sensing means and controlling said driving means in response thereto;
   means for selecting, as the output mode of said driving means, between a normally open and a normally closed mode; and
   means for indicating faults in said load being driven by said driving means including short-circuit and open-circuit faults; and
   wherein said driving means includes at least one driver which acts as a current source with respect to a load connected to it, and at least one driver which acts as a current sink with respect to a load attached to it.

10. A switching circuit as recited in claim 9 wherein each of said driving means comprises first semiconductor switching means for switching current through said load, and second semiconductor means for protecting said first semiconductor switching means from overcurrent.

11. A switching circuit as recited in claim 10 wherein said output mode selecting means includes a full wave rectifying bridge, and wherein said mode selection is accomplished by the polarity of connection of a D.C. source to said bridge.

12. A switching circuit as recited in claim 11 wherein said fault indicating means comprises visual indicating means.

13. A switching circuit as recited in claim 12 wherein said visual indicating means flashes on and off when a fault is determined to exist.

14. A switching circuit, for receiving a signal from a sensing means and for driving a load in response to said signal, comprising in combination:
   means for regulating and supplying power to said circuit;

at least one means for driving said load using power supplied by said power regulation and supply means;

input logic means for receiving said signal from said sensing means and controlling said driving means in response thereto; and means for indicating faults in said load being driven by said driving means, including both short circuit and open-circuit faults, and wherein said driving means includes at least two drivers, each acting as a current source with respect to its load, at least one of which is permanently in a normally closed mode, while at least one is at least permanently in a normally open mode.

15. A switching circuit, for receiving a signal from a sensing means and for driving a load in response to said signal, comprising in combination:

means for regulating and supplying power to said circuit;

at least one means for driving said load using power supplied by said power regulation and supply means;

input logic means for receiving said signal from said sensing means and controlling said driving means in response thereto; and means for indicating faults in said load being driven by said driving means, including both short-circuit and open-circuit faults; and wherein said driving means includes at least two drivers, each acting as a current sink with respect to its load, at least one of which is permanently in a normally closed mode, while at least one is permanently in a normally open mode.

16. A switching circuit as recited in claims 14 or 15 wherein said fault indicating means includes a visual indicating means connected to each of said driving means, which is on whenever the respective driving means is on, such that a fault is indicated whenever one of the indicating means connected to one of said normally open drivers is off at the same time as the indicating means connected to one of said normally closed drivers.

* * * * *